(12) United States Patent
Chilappagari et al.

(10) Patent No.: US 9,009,574 B2
(45) Date of Patent: Apr. 14, 2015

(54) IDENTIFICATION AND MITIGATION OF HARD ERRORS IN MEMORY SYSTEMS

(75) Inventors: Shashi Kiran Chilappagari, San Jose, CA (US); Gregory Burd, San Jose, CA (US); Zhengang Chen, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 179 days.

(21) Appl. No.: 13/481,376

(22) Filed: May 25, 2012

(65) Prior Publication Data

US 2012/0317460 A1 Dec. 13, 2012

Related U.S. Application Data

(60) Provisional application No. 61/494,333, filed on Jun. 7, 2011, provisional application No. 61/497,907, filed on Jun. 16, 2011.

(51) Int. Cl.
*H03M 13/00* (2006.01)
*G11C 29/02* (2006.01)
*G06F 11/10* (2006.01)
*G11C 29/52* (2006.01)
*G11C 29/04* (2006.01)

(52) U.S. Cl.
CPC .......... *G11C 29/028* (2013.01); *G06F 11/1048* (2013.01); *G11C 29/52* (2013.01); *G11C 2029/0411* (2013.01)

(58) Field of Classification Search
USPC ................................... 714/774, 758
See application file for complete search history.

(56) References Cited

U.S. PATENT DOCUMENTS

| 7,813,453 | B2 * | 10/2010 | Khandekar et al. | ........... 375/340 |
|---|---|---|---|---|
| 8,468,424 | B2 * | 6/2013 | Mokhlesi et al. | ............. 714/773 |
| 2005/0157822 | A1 * | 7/2005 | Khandekar et al. | ........... 375/340 |
| 2008/0244162 | A1 * | 10/2008 | Mokhlesi et al. | ............. 711/103 |
| 2008/0250300 | A1 * | 10/2008 | Mokhlesi et al. | ............. 714/780 |
| 2010/0088575 | A1 * | 4/2010 | Sharon et al. | ................. 714/763 |
| 2011/0131473 | A1 * | 6/2011 | Mokhlesi et al. | ............. 714/773 |
| 2011/0205823 | A1 * | 8/2011 | Hemink et al. | ............... 365/211 |

* cited by examiner

*Primary Examiner* — M. Mujtaba K Chaudry

(57) ABSTRACT

Embodiments provide a method comprising estimating a first set of log-likelihood ratio (LLR) values for a plurality of memory cells of a memory; based on the first set of LLR values, performing a first error correcting code (ECC) decoding operation; in response to determining a failure of the first ECC decoding operation, generating, by adjusting the first set of LLR values, a second set of LLR values for the plurality of memory cells; and based on the second set of LLR values, performing a second ECC decoding operation.

12 Claims, 11 Drawing Sheets

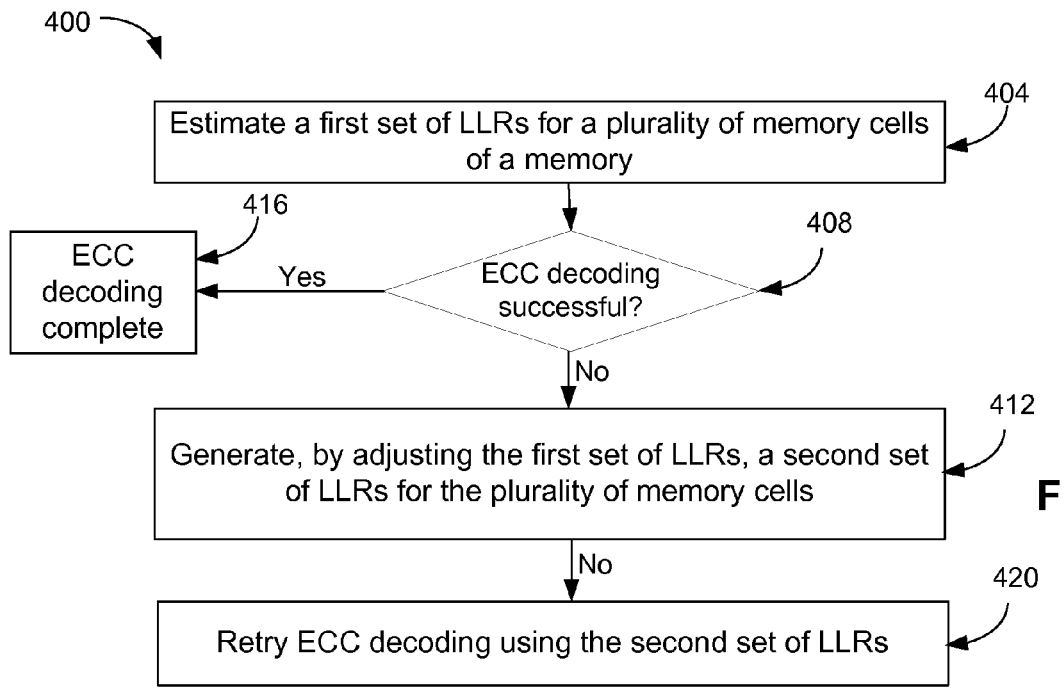
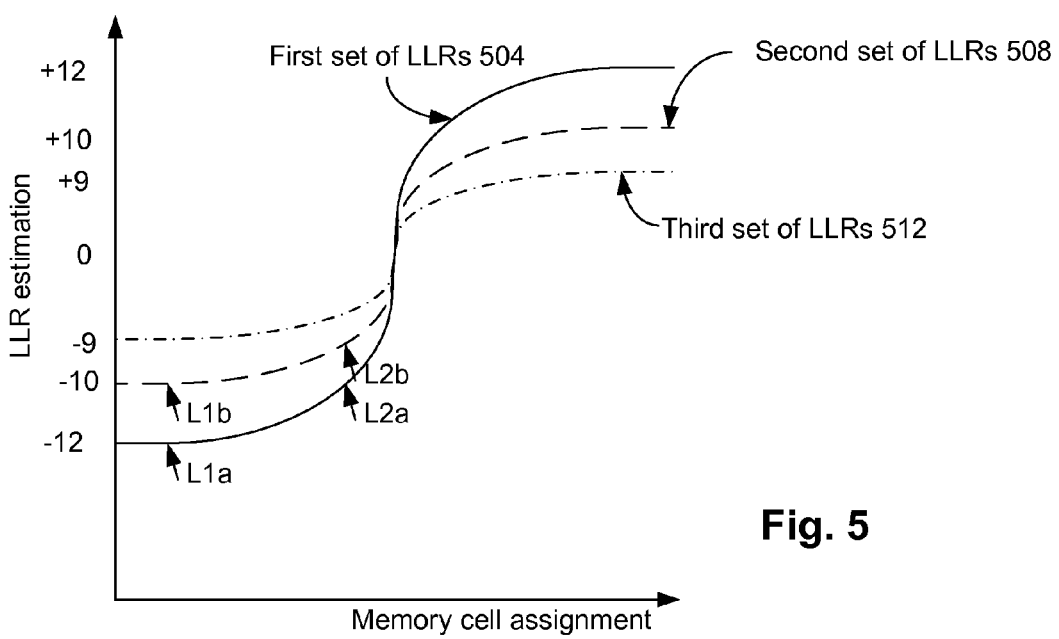

IDENTIFICATION AND MITIGATION OF HARD ERRORS IN MEMORY SYSTEMS

CROSS-REFERENCES TO RELATED APPLICATIONS

The present disclosure claims priority to U.S. Provisional Patent Application No. 61/494,333 filed Jun. 7, 2011, and to U.S. Provisional Patent Application No. 61/497,907 filed Jun. 16, 2011, the entire disclosures of which are hereby incorporated by reference in their entireties.

TECHNICAL FIELD

Embodiments of the present disclosure relate to the field of memory systems, and more particularly, to hard errors in memory systems.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

A memory system (e.g., a flash memory system) generally includes a decoder to decode data read from a memory. The decoder, for example, uses iterative soft decoding algorithms. For example, the decoder employs error correcting codes (ECC) such as low density parity check (LDPC) codes, Reed-Solomon (RS) codes, Turbo codes, or the like.

Errors in a memory system can include hard errors and soft errors. A log-likelihood ratio (LLR) for a memory cell is associated with a probability of a data bit in the memory cell being equal to 1 or 0. An error in estimation of a LLR for a memory cell, as a result of a hard error in the memory cell, is usually significant, for example, compared to an error in estimation of an LLR as a result of a soft error. Due to the significant error in the estimation of the LLR associated with a hard error, performance of a soft decoding algorithm (e.g., LDPC codes) deteriorates significantly in presence of hard errors in the data to be decoded, even if only a limited number of hard errors are present in the data. Performance of the soft decoding algorithm deteriorates significantly even if the hard error rate in the data is relatively low.

SUMMARY

In various embodiments, there is provided a method comprising estimating a first set of log-likelihood ratio (LLR) values for a plurality of memory cells of a memory; based on the first set of LLR values, performing a first error correcting code (ECC) decoding operation; in response to determining a failure of the first ECC decoding operation, generating, by adjusting the first set of LLR values, a second set of LLR values for the plurality of memory cells; and based on the second set of LLR values, performing a second ECC decoding operation.

The present disclosure also provides a method for operating a memory comprising a plurality of word lines, wherein each of the plurality of word lines comprises M number of memory cells, wherein M is an integer, wherein the memory further comprises M number of bit lines, wherein each of the M number of bit lines is associated with a corresponding memory cell of the M number of memory cells in each of the plurality of word lines, and where the method comprises while decoding read data from each of a subset of the plurality of word lines, identifying that for each of at least a first number of word lines, a Kth memory cell of the M number of memory cells has an error; and in response to the first number being greater than a threshold, determining that the Kth bit line of the M number of bit lines is faulty.

The present disclosure also provides a method for processing a memory cell in a memory, wherein the memory includes a memory cell, where the memory cell is configured to store at least a first bit and a second bit, the method comprising decoding read data associated with the first bit by correcting a first value of the first bit to a second value, wherein the second value corresponds to N number of threshold voltage ranges of the memory cell; failing to decode read data associated with the second bit; and in response to failing to decode read data associated with the second bit, based on (i) the read data associated with the first bit and (ii) the read data associated with the second bit, identifying a first threshold voltage range associated with the second bit, determining if the first threshold voltage range is neither adjacent to, nor include in at least one of the N number of threshold voltage ranges, and processing the memory cell based on the determination.

BRIEF DESCRIPTION OF THE DRAWINGS

Embodiments will be readily understood by the following detailed description in conjunction with the accompanying drawings. Embodiments are illustrated by way of example and not by way of limitation in the figures of the accompanying drawings.

FIG. 4 illustrates an example of a method for adjusting estimated LLRs, to mitigate effects of hard errors in one or more memory cells of a memory.

FIG. 5 illustrates example of various graphs depicting adjustment of estimated LLRs.

DETAILED DESCRIPTION

Figure 1:
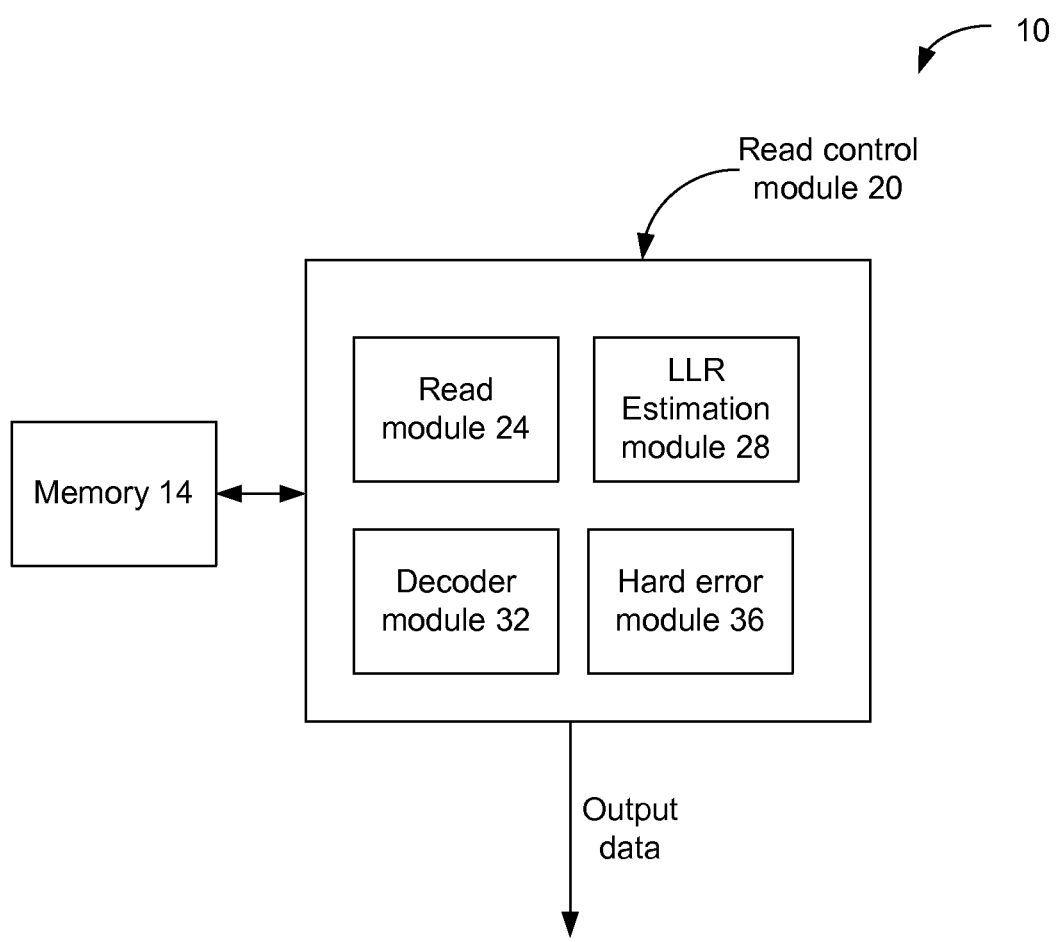
FIG. 1 schematically illustrates an example of a memory system.

FIG. 1 schematically illustrates an example of a memory system 10. The memory system 10 includes a memory 14. The memory 14 is any appropriate type of memory, e.g., a volatile memory (e.g., an appropriate type of random-access memory), a non-volatile memory (e.g., a read-only memory), or the like. In an embodiment, the memory 14 is an electrically-erasable programmable read-only memory (EEPROM), e.g., a flash memory.

Although not illustrated in FIG. 1, the memory 14 includes a plurality of memory blocks, where each memory block includes a plurality of memory cells, with each memory cell storing one or more bits of data. For example, individual memory cells of the memory 14 can be a single-level cell (SLC), which stores a single bit of data. In another example, individual memory cells of the memory 14 can be a multi-level cell (MLC), which stores more than one bit of data.

The memory system 10 includes a read control module 20, which comprises a read module 24, an LLR estimation module 28, a decoder module 32, and a hard error module 36. The read control module 20 is configured to read and decode data from the memory 14. Although not illustrated in FIG. 1, the memory system 10 also includes various other components, e.g., a write control module configured to write data in the memory 14 (e.g., possibly after encoding and/or encrypting the data), an encoding module, and/or the like.

In an embodiment, one or more components of the read control module 20 may be implemented using, for example, an electronic circuit, a processor, a combinational logic circuit, and/or other suitable components.

In various embodiments, data is read by the read control module 20 from the memory 14 in the unit of memory pages. That is, data bits from memory cells of a memory page of the memory 14 are read during a single read cycle. During a read cycle, the read module 24 applies a reference voltage to individual memory cells of a memory page. For a given memory cell, the read module 24 determines whether a voltage level of the memory cell is higher or lower compared to the applied reference voltage. Based on this determination, the LLR estimation module 28 and/or the decoder module 32 estimates whether a bit zero or a bit one is stored in the memory cell, e.g., if the memory cell is a SLC. If the memory cell is a MLC, multiple reference voltages are applied to estimate the bits stored in the memory cell. Thus, a read cycle is associated with one or more reference voltages, which are applied to the memory cells of a memory page of the memory 14 during the read cycle.

The LLR estimation module 28 provides soft estimation of the data bits of the memory cells of the memory 14, when the read module 24 reads data from the memory cells. For example, the LLR estimation module 28 provides in the form of LLRs, probability of each data bit being 0 or 1. The LLRs are indicative of a confidence in zero ('0') or one ('1') for each data bit read from the memory 14. Based on the estimated LLRs for the data bits, the decoder module 32 decodes the data. Estimation of LLRs directly affects the decoding performance, and the performance of the memory system 10. LLR for a data bit may be defined as $$LLR = \log\left(\frac{\text{Probability of the data bit being equal to 0}}{\text{Probability of the data bit being equal to 1}}\right).$$

Thus, a positive LLR indicates a greater probability of the data bit being equal to 0, and a negative LLR indicates a greater probability of the data bit being equal to 1. That is, a sign of the LLR provides an estimation of the data bit, and a magnitude of the LLR provides a reliability of the estimation (e.g., |LLR|=0 means the estimation is completely unreliable, and |LLR|=∞ means that the estimation is completely reliable and the bit value is known). Example methods for determining LLRs may be found in, for example, in U.S. patent application Ser. No. 13/397,434 filed Feb. 15, 2012, the entire disclosure of which is hereby incorporated by reference in its entirety.

The decoder module 32 performs a decoding operation using iterative soft decoding techniques. For example, the decoder module 32 employs error correcting codes (ECC) such as, for example, low density parity check (LDPC) codes, Reed-Solomon (RS) codes, Turbo codes, or any other appropriate iterative soft decoding codes for ECC decoding of data.

In an embodiment, the hard error module 36 identifies hard errors in the memory 14, and/or mitigates effects of hard errors during the decoding process, as will be discussed in more detail herein.

Soft Errors and Hard Errors

Errors in a memory system generally include hard errors and soft errors. A soft error is a seemingly random error in reading and/or decoding of stored data. Soft error may be caused, for example, by occasional electrical noise, environmental conditions, aging of the memory 14, and/or the like.

In an example, an error in estimation of an LLR for a memory cell, as a result of a soft error in the memory cell, is not significant (e.g., compared to an error in estimation of an LLR as a result of a hard error). For example, a deviation in the estimation of the LLR from a mean value of the LLR for the bit actually stored in the memory cell, in case of the soft error in the memory cell, is not significant (e.g., compared to that in case of a hard error).

For example, as a result of a soft error, an LLR of a memory cell may be estimated as +1, while a bit 1 is being stored in the memory cell (e.g., mean value of the LLR for a bit 1 being stored in the memory cell is, for example, −12). In another example, as a result of a soft error, an LLR of another memory cell may be estimated as −2, while a bit 0 is being stored in the memory cell (e.g., mean value of the LLR for a bit 0 being stored in the memory cell is, for example, +12).

In contrast, an error in estimation of an LLR for a memory cell, as a result of a hard error in the memory cell, is significant (e.g., compared to the error in estimation of an LLR as a result of a soft error). For example, a deviation in the estimation of the LLR from a mean value of the LLR for the bit actually stored in the memory cell, in case of the hard error in the memory cell, is significantly large (e.g., compared to that in case of a soft error).

For example, as a result of a hard error, an LLR of a memory cell may be estimated as +11, while a bit 1 is being stored in the memory cell (where a mean value of the LLR for a bit 1 being stored in the memory cell is, for example, −12). That is, in this example, the estimated LLR is a large positive number, whereas a bit 1 is being stored in the memory cell (i.e., the LLR should have been a large negative number). In another example, as a result of a hard error, an LLR of another memory cell may be estimated as −10, while a bit 0 is being stored in the memory cell (where a mean value of the LLR for a bit 0 being stored in the memory cell is, for example, +12).

In an embodiment, a hard error represents a temporary, semi-permanent or a permanent electrical failure of a memory array, often restricted to a particular memory location (e.g., to one or more memory cells of a memory), but may also sometimes be associated with peripheral circuitry of the memory array so that the entire array can be affected.

In an example, due to the significant deviation in the estimation of the LLR associated with a hard error, performance of a soft decoding algorithm (e.g., LDPC codes) deteriorates significantly in presence of hard errors in the data to be decoded, even if only a limited number of hard errors are present in the data (i.e., performance of the soft decoding algorithm deteriorates significantly even if the hard error rate in the data is relatively low). Accordingly, it may be desirable to identify hard errors in the memory 14, and possibly mitigate the effects of hard error while decoding data from the memory 14 using a soft decoding algorithm.

Example Reasons Behind Occurrence of Hard Errors in a Memory

Figure 2:
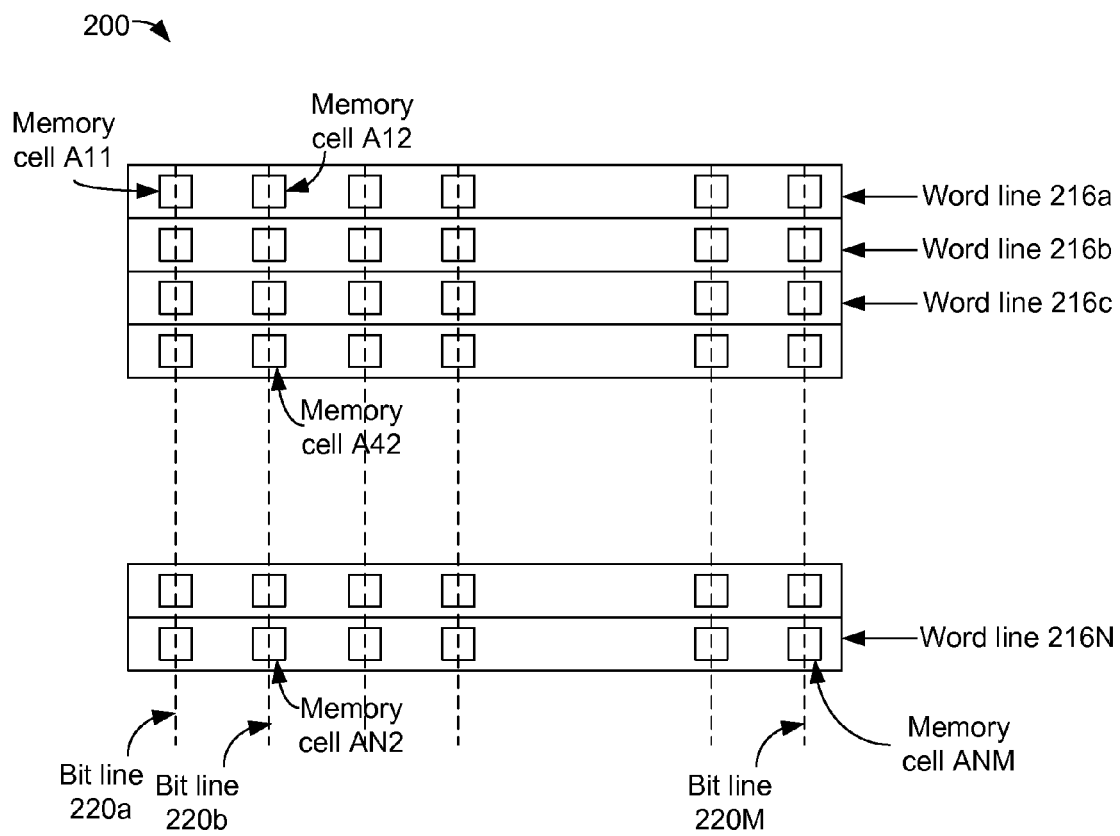
FIG. 2 illustrates a portion of a memory block of a memory.

FIG. 2 illustrates a portion of a memory block 200 of the memory 14 of FIG. 1. The memory block 200 has a plurality of word lines 216a, . . . , 216N, and a plurality of bit lines 220a, . . . , 220M, where M and N are appropriate integers. A respective memory cell is formed at a junction of a corresponding word line and a corresponding bit line, as illustrated in FIG. 2. For example, memory cells A11, A12, . . . , A1M are associated with the word line 216a, memory cells A21, A22, . . . , A2M are associated with the word line 216b, and so on (although not all memory cells are labeled in FIG. 2 for purposes of illustrative clarity). Similarly, memory cells A11, A21, . . . , AN1 are associated with the bit line 220a, memory cells A12, A22, . . . , AN2 are associated with the bit line 220b, and so on. A memory cell is programmed or read by applying and/or sensing voltages in the corresponding word line and the corresponding bit line.

Unless otherwise mentioned and for the purposes of this disclosure, a memory page associated with a word line includes the memory cells of the word line. For example, memory cells A11, A12, . . . , A1M form a memory page, which is associated with the word line 216a. In an embodiment, all the memory cells in a memory page (i.e., all the memory cells in the corresponding word line) are read during a single read cycle (and programmed during a single programming cycle).

In an embodiment, hard errors can occur in a plurality of memory cells of a memory block due to, for example, a faulty bit line. For example, if the bit line 220b is faulty, some or all of the memory cells A12, A22, . . . AN2 may not be programmed correctly. For example, if the memory cells A12, A22, . . . AN2 are SLC memory cells, then about half the memory cells A12, A22, . . . AN2 may be programmed wrongly due to a fault in the bit line 220b. In another example, if the memory cells A12, A22, . . . AN2 are 2 bit MLC memory cells, then about ¾$^{th}$ of all the memory cells A12, A22, . . . AN2 may be programmed wrongly due to a fault in the bit line 220b.

In an embodiment, a memory cell in the memory 14 may get stuck to a certain programmed value, resulting in a hard error in the memory cell. For example, during a first programming cycle of a 2 bit memory cell, the memory cell is programmed to 11. During a second programming cycle of the memory cell during which the memory cell is to be programmed to, for example, 10, the memory cell fails to be programmed to the 10 value (e.g., due to a fault in the memory cell). Accordingly, after the second programming cycle, the memory cell will continue to store 11, even though a 10 was intended to be stored in the memory cell, thereby resulting in a hard error. Such a memory cell is also referred herein as a "stuck memory cell." A stuck memory cell may be stuck temporarily (e.g., only for one programming cycle), semi-permanently (e.g., for a few programming cycles), or permanently (e.g., for any number of programming cycles). In an example, a stuck SLC memory cell has about 50% probability of being programmed correctly. In another example, if a stuck memory cell is a 2 bit MLC memory cell, then the stuck memory cell may be programmed correctly with about 25% probability.

Although two example reasons of hard errors in the memory 14 are discussed above (e.g., hard errors due to faulty bit lines, and hard errors due to stuck memory cells), there may be other reasons associated with hard errors in the memory 14 (e.g., a fault in a circuit associated with one or more memory cells of the memory 14, and/or the like).

Identifying and/or Mitigating Effects of Hard Errors

As previously discussed, performance of a soft decoding algorithm (e.g., LDPC code) deteriorates significantly in presence of hard errors in the data to be decoded. Accordingly, it is desirable to mitigate the effects of hard errors while decoding data read from the memory 14.

Figure 3:
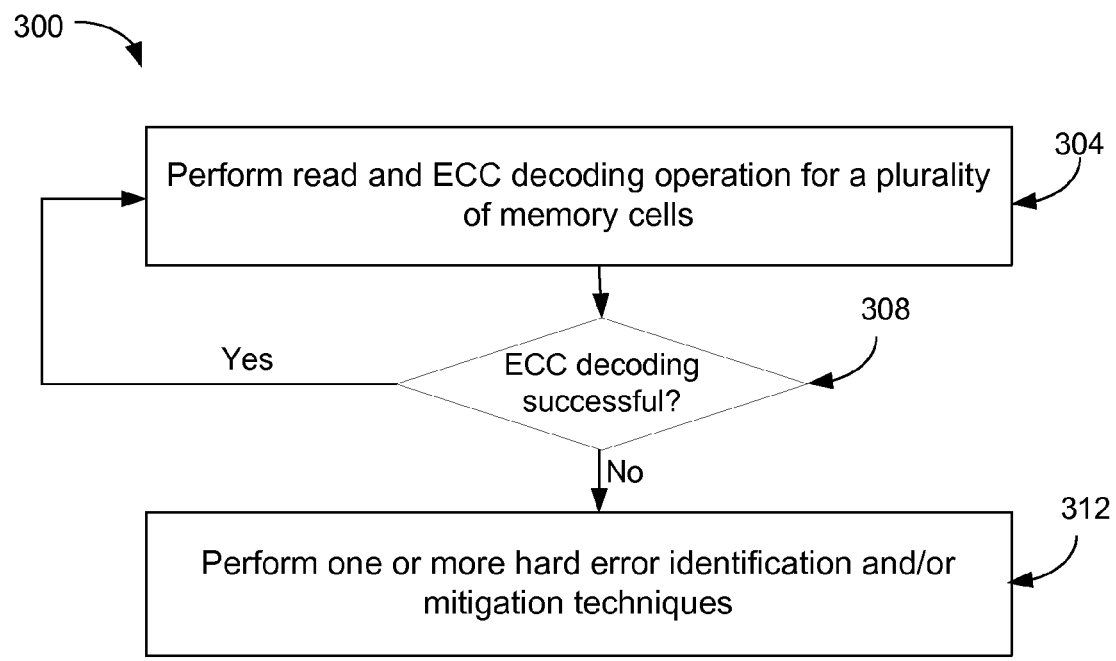
FIG. 3 illustrates an example of a method for ECC decoding data stored in a memory.

FIG. 3 illustrates an example of a method 300 for ECC decoding data stored in the memory system 10. At 304, the read module 24 of FIG. 1 performs a read operation on a plurality of memory cells of the memory 14, the LLR estimation module 28 estimates the associated LLRs, and decoder module 32 performs an ECC decoding based on the estimated LLR. If the ECC decoding is successful at 308 (i.e., if "Yes" at 308), the method 300 loops back at 304 (e.g., performs read and decoding operation of another plurality of memory cells of the memory 14).

If the ECC decoding at 308 fails (i.e., if "No" at 308), the read control module 20 (e.g., the hard error module 36) performs one or more hard error identification and/or mitigation techniques. The one or more hard error identification and/or mitigation techniques of 312 of the method 300 will be discussed in more detail herein.

Mitigating Effects of Hard Errors using LLR Adjustment

As previously discussed, an error in an estimation of an LLR for a memory cell, as a result of a hard error in the memory cell, is significant. In an example, it is assumed that estimation of LLRs for the memory cells of the memory 14 can range between −12 to +12 (i.e., the estimated LLRs can range from −12 to +12, although such a range is merely an example, and does not limit the teachings of this disclosure). In an example, as a result of a hard error in a first memory cell, an LLR of the first memory cell is estimated as +11, while a bit 1 is being stored in the first memory cell. That is, in this example, the mean value of the LLR, based on bit 1 being stored in the first memory cell, is a relatively large negative number (e.g., −12); while the estimated LLR for the first memory cell is a large positive number (i.e., +11). Thus, there is a large error in the estimation of the LLR for the first memory cell, due to the hard error. Furthermore, due to the large magnitude of the estimated LLR (i.e., 11), during the decoding process, the decoder module 32 considers the first memory cell to store a bit 0 with very high probability (i.e., the decoder module 32 assumes, with very high confidence, that a bit 0 is stored in the memory)—while in reality, a bit 1 was intended to be programmed in the first memory cell. As a result, during the decoding process, it is relatively difficult for the decoder module 32 to even consider the possibility that a bit 1 (and not a bit 0) may be stored in the first memory cell. In an embodiment, to counter or mitigate such high confidence in the decoder module 32's assumption regarding data bits stored in various memory cells of the memory 14, estimation of the LLRs for various memory cells are adjusted, as discussed below.

FIG. 4 illustrates an example of a method 400 for adjusting estimated LLRs, to mitigate effects of hard errors in one or more memory cells of the memory 14. FIG. 5 illustrates an example of various graphs depicting the adjustment of the estimated LLRs. Referring to FIGS. 1, 4 and 5, at 404, the LLR estimation module estimates a first set of LLRs for a plurality of memory cells of a memory (e.g., memory 14 of FIG. 1). The estimation of the first set of LLRs is based, for example, on a read operation performed by the read module 24 on the plurality of memory cells.

In an embodiment, the first set of LLRs includes a plurality of estimated LLRs (e.g., corresponding to the plurality of memory cells). In an embodiment, the first set of LLRs includes one or more LLR estimations corresponding to one or more of the plurality of memory cells, which have hard errors. That is, the one or more LLR estimations of the first set of LLRs, corresponding to the one or more memory cells, have significant errors.

In an embodiment, the first set of LLRs comprises the plurality of estimated LLRs (e.g., corresponding to the plurality of memory cells) that ranges between, for example, −12 to +12 (as discussed in the above example). For example, FIG. 5 illustrates the first set of LLRs as a graph 504 (labeled as "first set of LLRs 504" in FIG. 5). As illustrated in FIG. 5, individual memory cells of the plurality of memory cells are assigned LLR estimations, of the first set of LLRs, ranging from −12 to +12.

Referring again to FIG. 4, at 408, the decoder module 32 attempts to ECC decode data read from the plurality of memory cells, based on the corresponding first set of LLRs. If the ECC decoding is successful (i.e., if "Yes" at 408), the current reading and decoding operation of the plurality of memory cells ends at 416.

However, if the ECC decoding operation fails at 408 (i.e., if "No" at 408), at 412, the read control module 20 (e.g., the hard error module 36) generates, by adjusting the first set of LLRS, a second set of LLRs for the plurality of memory cells. For example, each LLR in the first set of LLRs has a corresponding LLR in the second set of LLRs (i.e., individual LLRs in the first set of LLRs are mapped to corresponding LLRs in the second set of LLRs). In an embodiment, a range of the LLRs in the second set of LLRs is less than that of the first set of LLRs. The LLRs of the second set of LLRs range from, for example, −10 to +10, as illustrated in FIG. 5.

Mapping of the LLRs of the first set of LLRs to the corresponding LLRs in the second set of LLRs may be performed in a variety of manner, one of which is illustrated in FIG. 5. In the example illustrated in FIG. 5, an LLR of −12 in the first set of LLRs is mapped as −10 in the second set of LLR, an LLR of +12 in the first set of LLRs is mapped as +10 in the second set of LLR, and an LLR of 0 in the first set of LLRs is mapped as 0 in the second set of LLR. Other LLRs in the first set of LLRs are mapped, using a linear or a non-linear function, to corresponding LLRs in the second set of LLRs. For example, FIG. 5 illustrates an example curve to map an LLR in the first set of LLRs to a corresponding LLR in the second set of LLRs.

In an embodiment, magnitudes of individual LLRs in the first set of LLRs are decreased to generate the corresponding LLRs in the second set of LLRs. For example, magnitudes of LLRs L1a and L2a in the first set of LLRs are decreased to generate LLRs L1b and L2b, respectively, in the second set of LLRs. A first decrease in magnitude results while mapping the LLR L1a in the first set of LLRs to the LLR L1b in the second set of LLR, and a second decrease in magnitude results while mapping the LLR L2a in the first set of LLRs to the LLR L2b in the second set of LLR. In an embodiment, the first decrease in magnitude is greater than the second decrease in magnitude, in response to a magnitude of the LLR L1a being greater than a magnitude of the LLR L2a. That is, the higher the magnitude of an LLR in the first set of LLRs, the greater is the decrease in magnitude of the LLR while generating the corresponding LLR in the second set of LLRs.

Referring again to FIG. 4, at 420, the decoder module 32 retries ECC decoding using the second set of LLRs. Although not illustrated in FIG. 4, if the ECC decoding at 420 is not successful, a third set of LLRs is generated (e.g., as illustrated in FIG. 5) by adjusting the second set of LLRs, and ECC decoding is retried once again using the third set of LLRs, where a range of the third set of LLRs (e.g., which is between −9 to +9 in FIG. 5) is less than a range of the second set of LLRs.

In an embodiment, generation of the second set of LLRs by decreasing a range of the first set of LLRs helps mitigates effects of hard errors. For example, as previously discussed, as a result of a hard error in a first memory cell, an LLR of the first memory cell may be estimated as +11, while a bit 1 is being stored in the first memory cell. Thus, in this example, the first set of LLRs includes the +11 value for the first memory cell. However, while generating the second set of LLRs, the LLR value of +11 is mapped as, for example, +9.2 in the second set of LLRs. So, while the decoder module 32 attempts, at 420, to perform the ECC decoding, it uses the +9.2 as the LLR value for the first memory cell for the ECC decoding. That is, during this decoding operation, the decoder module 32 has relatively less confidence on the LLR estimate on the first memory cell (e.g., compared to the confidence it had based on the +11 LLR value for the first memory cell during the initial ECC decoding operation at 408). Accordingly, decreasing the range of the LLRs, while generating the second set of LLRs from the first set of LLRs, decreases a confidence of the decoder module 32 to LLRs having relatively high magnitudes. As hard errors (e.g., those hard errors which are difficult to detect during ECC decoding) are often associated with high magnitude LLR values, such a decrease in the range of LLRs (and resultant decrease in the magnitude of the LLRs) makes detection of hard errors easier by the decoder module 32.

Identification and Mitigation of Hard Errors due to Stuck Cells

Figure 6:
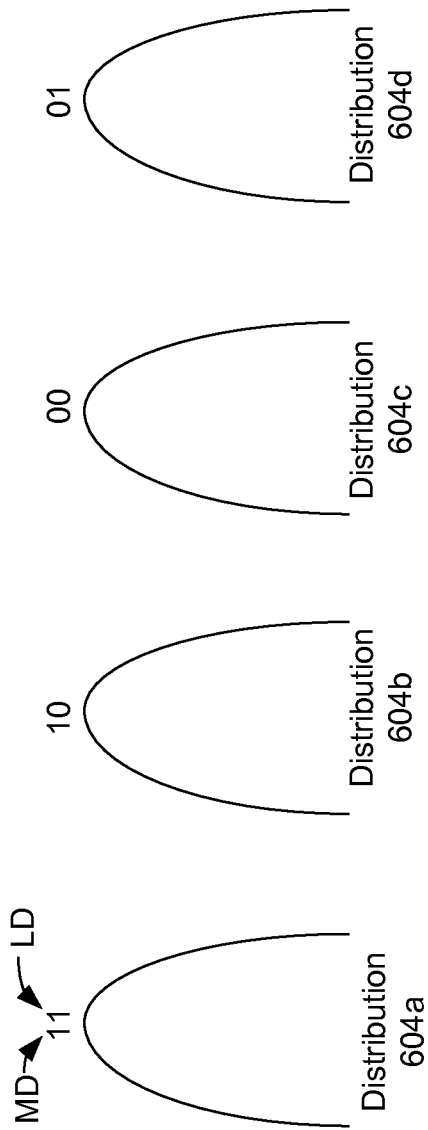
FIG. 6 illustrates examples of threshold voltage distributions of a 2 bit/cell memory cell.

FIG. 6 illustrates examples of threshold voltage distributions of a 2 bit/cell memory cell 600 of the memory 14 of FIG. 1. For example, in FIG. 6, a distribution 604a is associated with bit 11, a distribution 604b is associated with bit 10, a distribution 604c is associated with bit 00 and a distribution 604d is associated with bit 01. Thus, the memory cell 600 is a MLC memory cell. Although the memory cell 600 is assumed to be a 2 bit/cell memory cell, in another embodiment, the memory cell 600 can store any other appropriate number of bits (e.g., 3, 4, or the like), and a 2 bit/cell memory cell does not limit the teachings of this disclosure.

As previously discussed, a memory cell in the memory 14 can get stuck to a certain programmed value, resulting in a hard error in the memory cell. For example, the memory cell 600 can get stuck to a programmed value of 11. Accordingly, during a reprogramming the memory cell 600 to, for example, 00, the memory cell 600 can remain stuck to the previously programmed value of 11.

For the purposes of this disclosure and unless otherwise mentioned, a first bit (e.g., a left bit) of the 2 bit/cell memory cell 600 is referred as a maximum distance (MD) bit and a second bit (e.g., a right bit) of the 2 bit/cell memory cell 600 is referred as a least distance (LD) bit, as illustrated in FIG. 6.

In a multi-bit-per-cell device, each memory cell can store more than one bit. In an example, different device manufacturers may have different conventions in ordering of the bits in a memory cell. As an example, consider a 2 bits/cell device (e.g., memory cell 600 of FIG. 6) in which there are three possible reference voltages X, Y and Z. The value of one of the bits can be inferred by driving the reference voltage Y, while the value of the other bit can be inferred by driving the reference voltages X and Z. The bits in the memory cell can be ordered such that the most significant bit (MSB) for one manufacturer can be the least significant bit (LSB) for another manufacturer, and vice versa. In order to avoid this ambiguity, in this disclosure, the terms maximum distance (MD) bit and least distance (LD) bit for a 2 bits/cell device are used. The MD bit corresponds to the bit that can be inferred by driving, for example, the reference voltage Y, and LD bit corresponds to the bit that can be inferred by driving the reference voltages X and Z. The MD bit experiences less chance of error, thereby appearing to have greater distance between the adjacent states, compared to the LD bit. The terminology can be generalized to three bits per cell devices to have a MD bit, a central distance (CD) bit and an LD bit. More generally, a device with k bits/cell has k types of bits from 0 to (k−1). In the case of 2 bits/cell device, the MD bit is of type 0 and LD bit is of type 1. In a 3 bits/cell device, the MD bit is of type 0, the CD bit is of type 1 and the LD bit is of type 2.

Referring again to FIG. 6, in an embodiment, the memory cell 600 is included in a memory page 608 of the memory 14. The memory page 608 is associated with a word line (e.g., word line 216a of FIG. 2) of the memory 14, and comprises a plurality of memory cells, including the memory cell 600.

As a 2 bits/cell memory cell has four possible states, approximately $\frac{1}{4}^{th}$ of the 2 bit/cell memory cells, which are stuck cells, will be programmed to correct values. In an example, if the memory cell 600 is stuck at 11 and is to be programmed to 10, then the memory cell 600 is stuck to a correct MD value (but will have wrong LD values). In another example, if the memory cell 600 is stuck at 11 and is to be programmed to 01, then the memory cell 600 is stuck to a correct LD value (but will have wrong MD values). Similarly, in another example, if the memory cell 600 is stuck at 11 and is to be programmed to 00, then the memory cell 600 will have wrong MD and LD values.

While reading the bits of the memory cell 600, the MD bit is read and decoded first (e.g., while reading and decoding MD bits of the plurality of memory cells, including the memory cell 600, of the memory page 608), followed by reading and decoding the LD bit (e.g., while reading and decoding LD bits of the plurality of memory cells, including the memory cell 600, of the memory page 608).

The MD bit of the memory cell 600 is read by applying a reference voltage that has a value approximately between the distributions 604b and 604c (although, for example, more than one reference voltage can be applied, if application of a single reference voltage is not sufficient to decode the MD bit). Based on the applied reference voltage, an LLR value associated with the MD bit of the memory cell 600 is estimated, and the decoder module 32 decodes the MD bits of the plurality of memory cells of the memory page 608 to determine the MD bit value of the memory cell 600.

Subsequent to reading and decoding the MD bit of the memory cell, the read control module 20 attempts to read and decode the LD bit of the memory cell 600. For example, the LD bit of the memory cell 600 is read by applying two reference voltages (e.g., one approximately between the distributions 604a and 604b, and another approximately between the distributions 604c and 604d). Based on the applied reference voltages, an LLR value associated with the LD bit of the memory cell 600 is estimated, and the decoder module 32 decodes the LD bits of the plurality of memory cells of the memory page 608 to determine the LD bit value of the memory cell 600.

Figure 7:
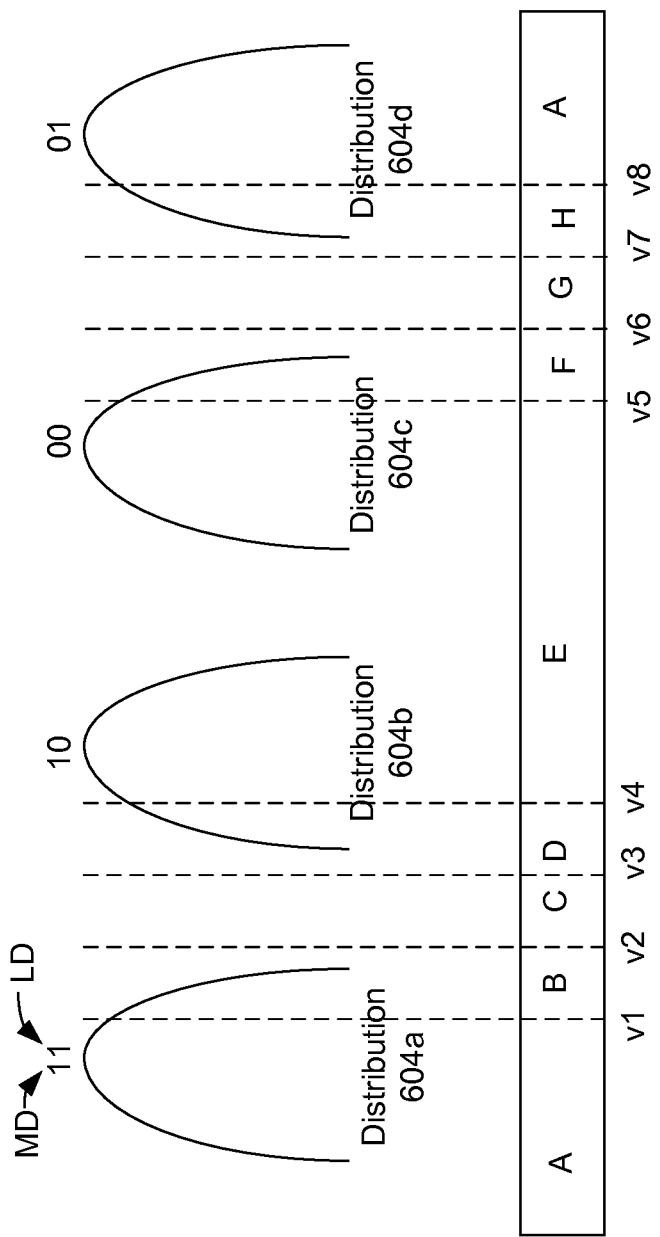
FIGS. 7-9 illustrate reference voltages that are applied to a memory cell.

If the decoding of the LD bit of the memory cell 600 fails, the read control module 20 (e.g., the read module 24) attempts to re-read the LD bit of the memory cell 600 by applying a plurality of references voltages. For example, reference voltages v1, ..., v8 are applied to the memory cell 600, as illustrated in FIG. 7. The reference voltages v1, ..., v8 partition the threshold voltage regions in regions A, B, ..., H and A. For example, if it is ascertained that the threshold voltage of the memory cell is more than v2, but less than v3, then it is determined that the threshold voltage of the memory cell 600 lies in the region C. In another example, if it is ascertained that the threshold voltage of the memory cell is more than v7, but less than v8, then it is determined that the threshold voltage of the memory cell 600 lies in the region H.

If it is ascertained that the threshold voltage of the memory cell is less than v1, then the LD bit of the memory cell is likely to be 1. Similarly, if it is ascertained that the threshold voltage of the memory cell is more than v8, then the LD bit of the memory cell is likely to be 1. That is, the threshold voltage region to the left of voltage v1 and the threshold voltage region to the right of voltage v8 are both associated with the LD bit of the memory cell 600 likely to be 1. Accordingly, both these threshold voltage regions are labeled as A.

Based on selection of one of the threshold voltage regions A, ..., H, the LLR estimation module 28 estimates an LLR for the LD bit, and the decoder module 32 attempts to decode the LD bit based on the estimated LLR. If the decoding of the LD bit fails, then the read control module 20 attempts to determine whether the memory cell 600 is a stuck cell.

To determine whether the memory cell 600 is a stuck cell, the read data associated with the MD bit is used again. For example, referring to FIG. 8, assume that a reference voltage v9 was previously applied to the memory cell 600 to read and decode the MD bit. The read data associated with the reference voltage v9 is used to further partition the threshold voltage region of the memory cell 600. It is to be noted that the read data associated with the reference voltage v9 includes a determination as to whether the threshold voltage of the memory cell 600 is greater than, or less than the reference voltage v9. Based on the reference voltages v1, ..., v9, the threshold voltage region of the memory cell 600 is partitioned in threshold voltage regions A', ..., J', as illustrated in FIG. 8, and one of the threshold voltage regions A', ..., J' is identified to include the threshold voltage of the memory cell 600.

Figure 8:
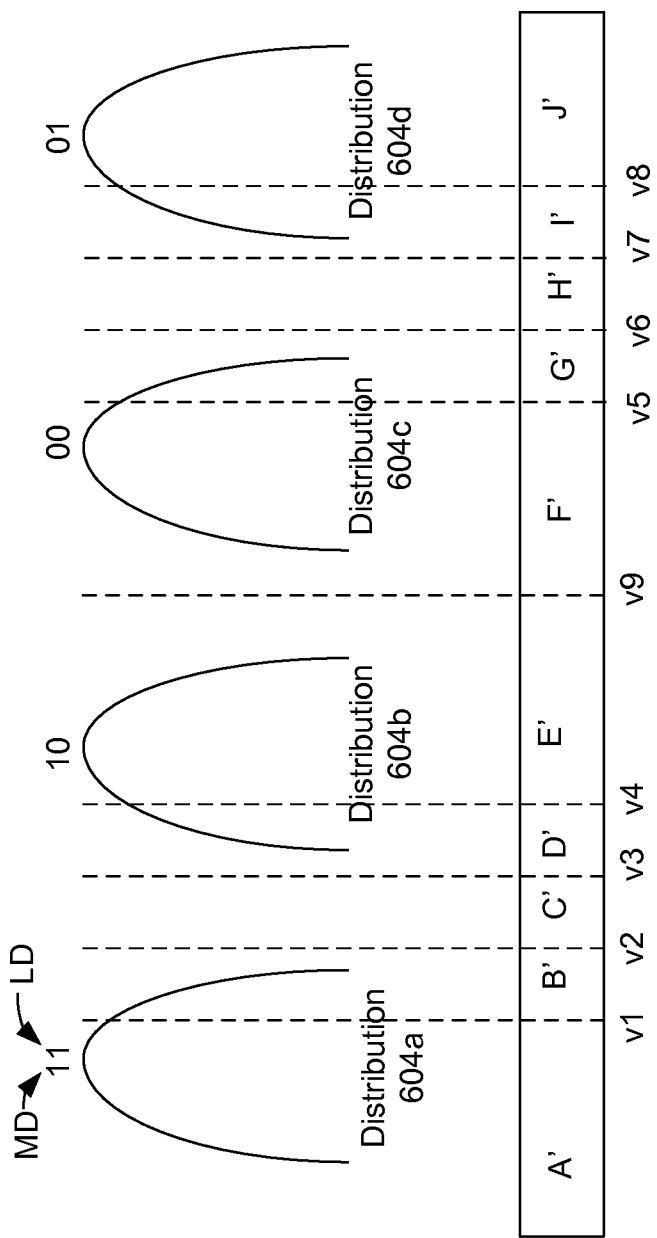

It is to be noted that unlike FIG. 7, in FIG. 8 the threshold voltage region to the left of the voltage v1 is distinguishable from the threshold voltage region to the right of the voltage v8. This is because, as MD bit information is now available, the threshold voltage region to the left of the voltage v1 is now likely to be 11, whereas the threshold voltage region to the right of the voltage v8 is now likely to be 01. Accordingly, in FIG. 8, the threshold voltage region to the left of the voltage v1 is labeled as A', and the threshold voltage region to the right of the voltage v8 is labeled as J'.

In FIG. 7, the threshold voltage region to the left of v1 and the threshold voltage region to the right of v8 were not distinguishable, as both the regions were associated with a value of 1 for the LD bit. However, using read data available for the MD bit, these two regions are now distinguishable, as illustrated in FIG. 8.

In an embodiment, if the MD bit was correctly identified during the MD bit read operation (i.e., while decoding the MD bit, there was no correction in value of the MD bit), no determination regarding whether the memory cell 600 is a stuck cell can be made (i.e., it cannot be determined whether the memory cell 600 is a stuck cell).

In an embodiment, if, the MD bit was incorrectly identified during the MD bit read operation (i.e., while decoding the MD bit, there was a correction in value of the MD bit), a determination can possibly be made regarding whether the memory cell 600 is a stuck cell, as will discussed in more detail herein.

Figure 9:
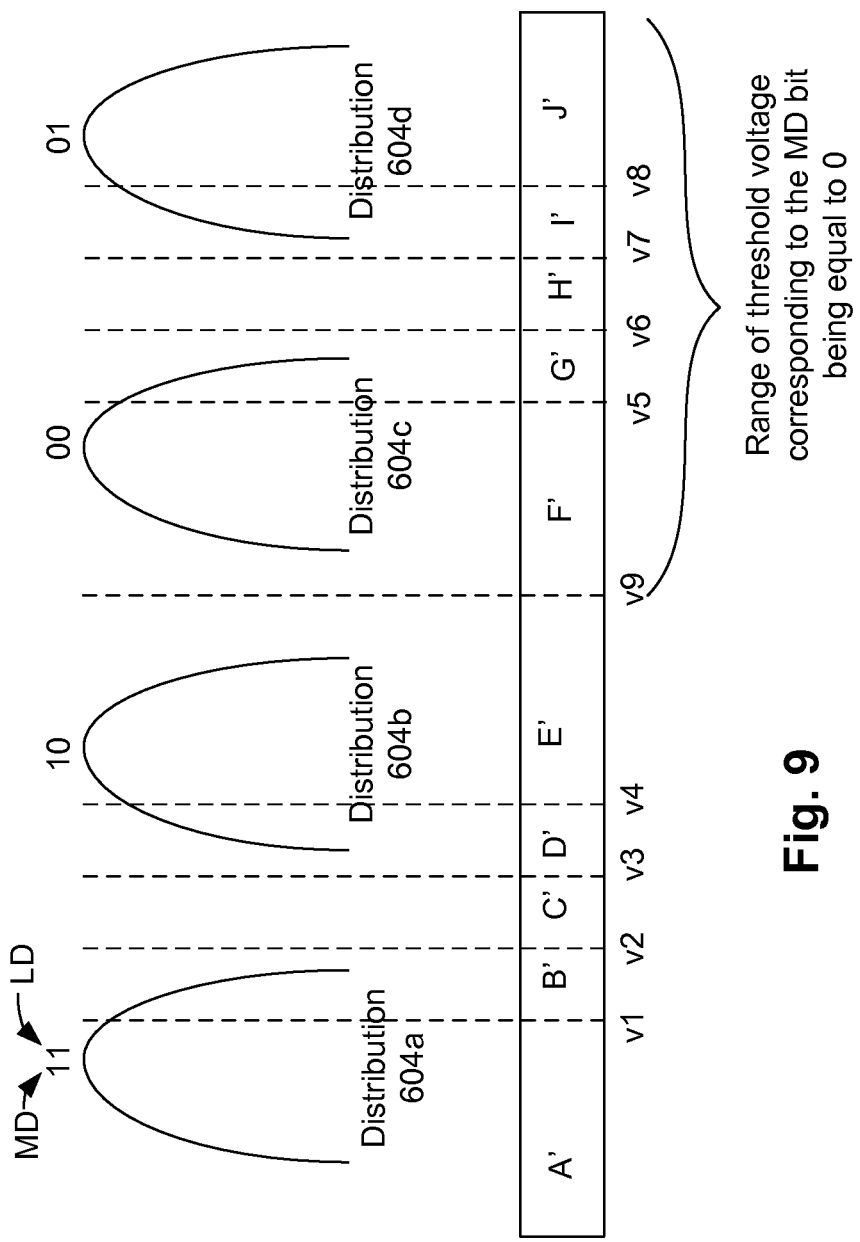

Assume that during the decoding of the MD bit, the MD bit value was corrected from 1 to 0. A range of threshold voltage of the memory cell, which corresponds to the MD bit being equal to 0, is illustrated in FIG. 9. That is, threshold voltage regions F', ..., J' corresponds to the MD bit being equal to 0. Thus, threshold voltage regions F', ..., J' corresponds to the correct value of the MD bit.

If, while reading the LD bit of the memory cell 600, the threshold voltage of the memory cell 600 is identified to be included in one of the threshold voltage regions F', ..., J', then a determination of a possibility of the memory cell 600 being a stuck cell is not possible. Similarly, if, while reading the LD bit of the memory cell 600, the threshold voltage of the memory cell 600 is identified to be included in the threshold voltage region E', then a determination of a possibility of the memory cell 600 being a stuck cell is not possible (as, in such a case, the actual threshold voltage of the memory cell 600 can be in the threshold voltage region F''; while due to a soft error, the threshold voltage region E' is identified as being the region that includes the threshold voltage of the memory cell 600).

In an embodiment, if, while reading the LD bit of the memory cell 600, the threshold voltage of the memory cell 600 is identified to be included in one of the threshold voltage regions A', ..., D', then the memory cell 600 is identified as a stuck cell. This is because, in such a case, the actual threshold voltage of the memory cell 600 is in one of the threshold voltage regions F', ..., J'; and there is a significant deviation between (i) the actual threshold voltage of the memory cell and (ii) the threshold voltage region identified as being the region that includes the threshold voltage of the memory cell 600. Put differently, if, while reading the LD bit of the memory cell 600, the threshold voltage of the memory cell 600 is identified to be included in one of the threshold voltage regions A', ..., D', then there will a significant error in the estimated LLR, resulting in a hard error.

If the memory cell 600 is identified as a stuck cell, the LLR estimation module 28 assigns an LLR of zero to the memory cell 600 (e.g., an LLR of zero signifies that the LLR estimation module 28 is unsure of what is stored in the memory cell 600). In an embodiment, as the MD bit was already decoded successfully, the LLR estimation module 28 assigns an LLR of zero to only the LD bit of the memory cell 600. In another embodiment, the LLR estimation module 28 assigns an LLR of zero to both the MD bit and the LD bit of the memory cell 600.

Once the zero LLR has been assigned to the memory cell 600 (e.g., to the LD bit of the memory cell 600), the decoder module 32 attempts to re-decode the LD bits of the memory page 608 using, for example, the zero LLR for the LD bit of the memory cell 600.

Figure 10:
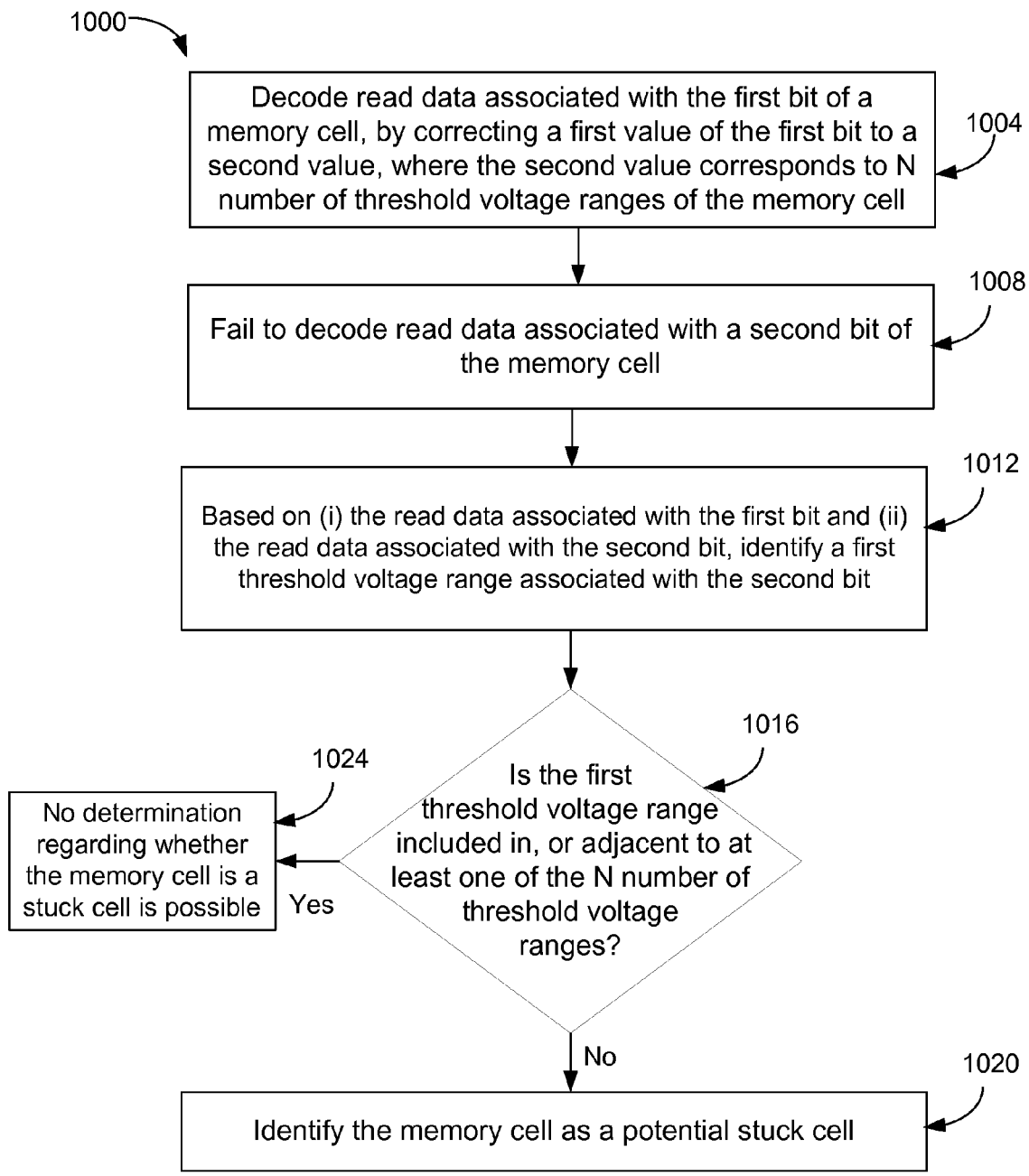
FIG. 10 illustrates an example of a method for identifying a stuck cell in a memory

FIG. 10 illustrates an example of a method for identifying a stuck cell in a memory (e.g., the memory 14). At 1004, the read control module 20 (e.g., the decoder module 32) decodes read data associated with the first bit (e.g., the MD bit) of a memory cell (e.g., memory cell 600). In an embodiment, while decoding the read data associated with the first bit, a first value of the first bit is corrected to a second value. For example, the MD bit of the memory cell 600 is corrected from 1 to 0, as previously discussed in an example. In an embodiment, the second value corresponds to N number of threshold voltage ranges of the memory cell, where N is an integer. For example, the second value of 0 of the MD bit of the memory cell 600 corresponds to five threshold voltage ranges (e.g., threshold voltage regions F', ..., J' of FIGS. 11 and 12) of the memory cell 600.

At 1008, the decoder module 32 fails to decode read data associated with a second bit (e.g., the LD bit) of the memory cell. The read data associated with the second bit includes, for example, read data corresponding to reference voltages v1, ..., v8, as illustrated in FIG. 7. It is to be noted that the read data associated with the second bit, in 1008 of the method 1000, includes read data that were read during the re-read of the LD bit of the memory cell 600 (e.g., as a previous read operation, not illustrated in FIG. 10, also failed).

At 1012, the read control module 20 (e.g., the hard error module 36) identifies, based on (i) the read data associated with the first bit and (ii) the read data associated with the second bit, a first threshold voltage range associated with the second bit. For example, based on (i) read data associated with the reference voltage v9 (which corresponds to the read data associated with the first bit) and (ii) read data associated with reference voltages v1, ..., v8 (which corresponds to read data associated with the second bit), the first threshold voltage range associated with the second bit is identified, where the first threshold voltage range is one of the threshold voltage ranges A', ..., J' of FIGS. 8 and 9.

At 1016, the read control module 20 (e.g., the hard error module 36) determines if the first threshold voltage range is included in, or adjacent to at least one of the N number of threshold voltage ranges (e.g., where the N number of threshold voltage ranges include threshold voltage regions F', ..., J').

If the first threshold voltage range is included in, or adjacent to at least one of the N number of threshold voltage ranges (i.e., if "Yes" at 1016), then no determination regarding whether the memory cell is a stuck cell can be made.

If the first threshold voltage range is neither included in, nor adjacent to at least one of the N number of threshold voltage ranges (i.e., if "No" at 1016), then at 1020, the memory cell is identified as a potential stuck cell.

Although not illustrated in FIG. 10, if the memory cell 600 is identified as a stuck cell, the LLR estimation module 28 assigns an LLR of zero to the memory cell 600 (e.g., to the second bit of the memory cell 600). Once the zero LLR has been assigned to the memory cell 600, the decoder module 32 attempts to re-decode the LD bits of the memory page 608 using, for example, the zero LLR for the LD bit of the memory cell 600.

Although the memory cell 600 of FIGS. 6-9 is a 2 bit/cell memory cell, in an embodiment, the method 1000 can be generalized to memory cells configured to store any number (e.g., three, four, or the like) of bits, as would be readily understood by those skilled in the art based on the teachings of this disclosure.

In some of the embodiments discussed previously herein (e.g., discussed with respect to FIGS. 7-10), the MD bit of a memory cell is read and decoded first, and then an attempt is made to read and decode the LD bit of the memory cell. However, in an embodiment, an attempt may be made to read and decode the LD bit of the memory cell prior to reading and decoding the MD bit. For example, in an embodiment, an attempt is made to read and decode the LD bit of the memory cell. If the decoding of the LD bit fails, then the MD bit is read and decoded. Using information of the MD bit, another attempt is made to (i) decode the LD bit (e.g., as discussed with respect to FIGS. 7-10), and (ii) potentially identify the memory cell as a stuck cell.

Identification and Mitigation of Hard Errors due to Faulty Bit Lines

Figure 11:
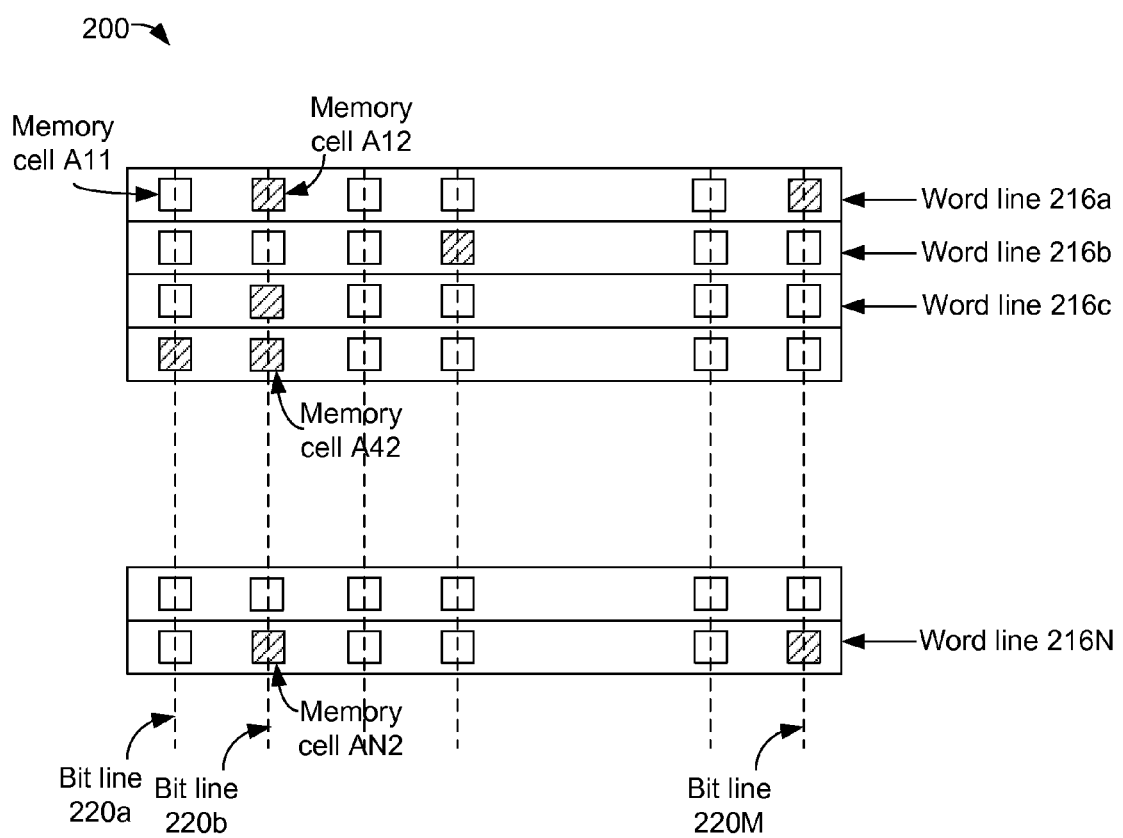
FIG. 11 illustrates a plurality of memory cells of a portion of a memory block of a memory, wherein some of the plurality of memory cells are erroneously programmed.

FIG. 11 illustrates a portion of a memory block 1400 of the memory 14 of FIG. 1. A structure of the portion of the memory block 1400 in FIG. 11 is similar to that in FIG. 2. For example, the portion of the memory block 1400 includes word lines 216a, . . . , 216N, and bit lines 220a, . . . , 220M, and each word line includes M number of memory cells.

While decoding read data from, for example, memory cells A11, A12, . . . , A1M of the first word line 216a, one or more memory cells (e.g., memory cells Al2 and A1M) may be identified to be incorrectly programmed (e.g., identified to store a 0, instead of storing a 1). In FIG. 11, the memory cells that are identified to be incorrectly programmed are marked using shades.

Once memory cells of a plurality of word lines (e.g., word lines 216a, . . . , 216N) have been decoded, several memory cells may be identified to be incorrectly programmed. In an embodiment, if, for a given bit line, more than a threshold number of memory cells associated with the bit line are identified to be programmed incorrectly, there may be a possibility that the bit line is faulty. For example, if there are 128 word lines (i.e., N=128 in FIG. 11), then each bit line is associated with 128 memory cells. If, for example, at least 30 memory cells associated with a bit line are identified to be programmed incorrectly (i.e., if the threshold number is 30), then there is a high probability that the bit line is faulty.

In an embodiment, the threshold is a programmable and is dynamic adjusted. For example, as the memory 14 ages, the performance of the memory cells of the memory 14 deteriorates. For example, for a memory that has been in use for a relatively long time, a number of memory cells may become faulty or may exhibit soft errors, but such faulty memory cells and/or the soft errors may not be associated with a faulty bit line. Accordingly, to accommodate such factors, the threshold is, for example, increased with an age of the memory 14.

In an embodiment, to determine a faulty bit line, not all the word lines needs to be decoded. In an example, only a subset of the N word lines of FIG. 11 are decoded to determine that more than the threshold number of memory cells associated with a bit line are programmed incorrectly. Accordingly, the bit line is identified as a faulty bit line.

In an embodiment, memory cells associated with a faulty bit line are marked for erasure, e.g., assigned zero LLRs (e.g., as the bit line is faulty, the LLR estimation module 28 is not sure whether a 0 or 1 is stored in the associated memory cells, and accordingly, assigns the zero LLR to these memory cells).

Figure 12:
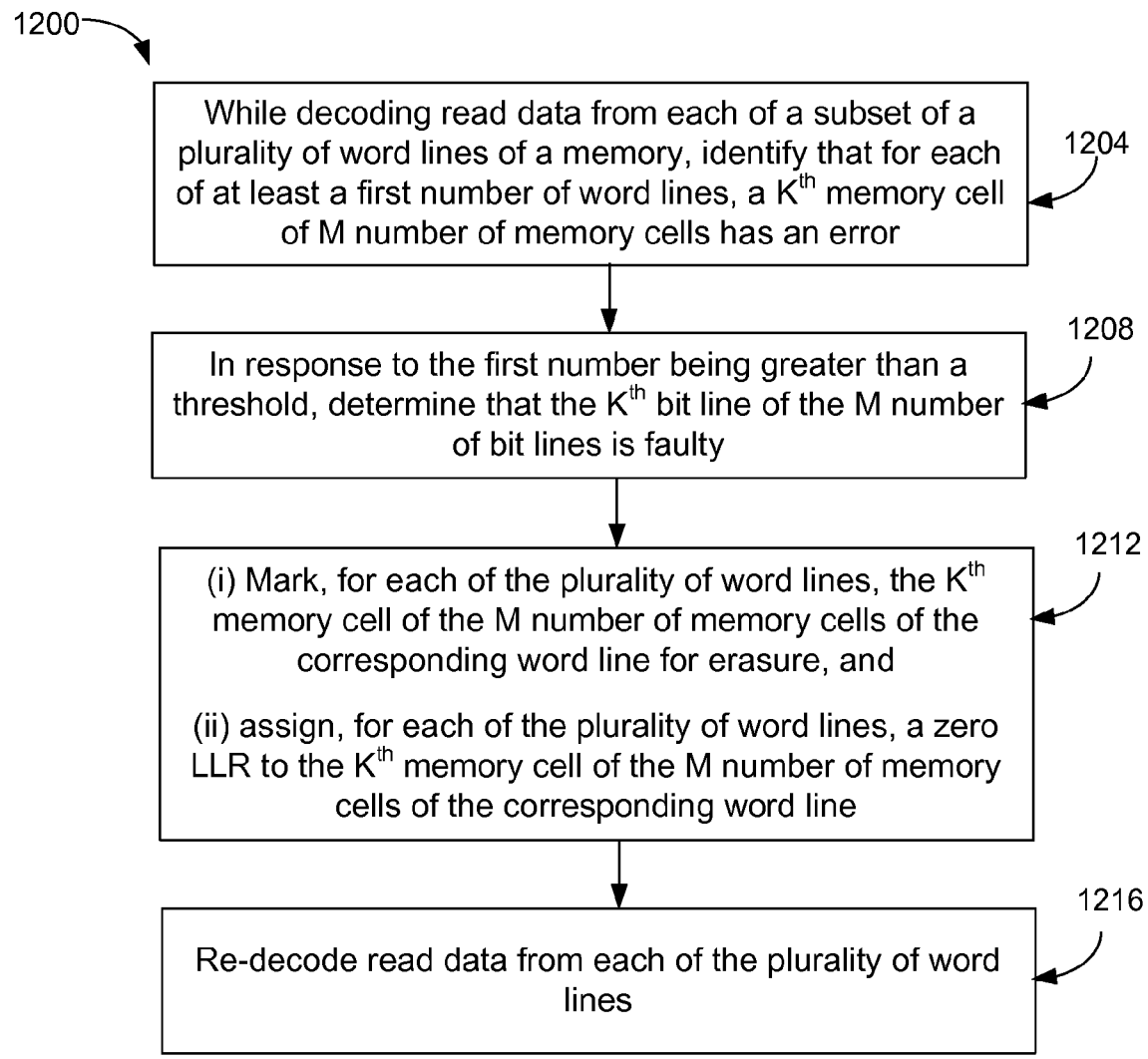
FIG. 12 illustrates an example of a method to identify a faulty bit line in a memory.

FIG. 12 illustrates an example of a method to identify a faulty bit line in a memory (e.g., memory 14 of FIG. 1). In an embodiment, the memory comprises a plurality of word lines (e.g., word lines 216a, . . . , 216N), where each of the plurality of word lines comprises M number of memory cells (e.g., word line 216a comprises memory cells A11, A12, . . . , A1M), where M is an integer, where the memory further comprises M number of bit lines (e.g., bit lines 220a, . . . , 220M), where each of the M number of bit lines is associated with a corresponding memory cell of the M number of memory cells in each of the plurality of word lines (e.g., bit line 220b is associated with memory cells A12, A22, A32, . . . , AN2).

Referring again to FIG. 12, at 1204, while decoding read data from each of the plurality of word lines (or from each of a subset of the plurality of word lines), the read control module 20 (e.g., the decoder module 32) identifies that for each of at least a first number of word lines, a $K^{th}$ memory cell of the M number of memory cells has an error. For example, as illustrated in FIG. 11, it is identified that for at least each of 4 word lines, a $2^{nd}$ cell of the M memory cells (e.g., cells A12, A32, A42 and An2) has an error.

At 1208, in response to the first number being greater than a threshold, the read control module 20 (e.g., the hard error module 36) determines that the $K^{th}$ bit line of the M number of bit lines is faulty. At 1212, the read control module 20 (e.g., the LLR estimation module 28) marks, for each of the plurality of word lines, the $K^{th}$ memory cell of the M number of memory cells of the corresponding word line for erasure. For example, referring to FIG. 11, if the bit line 220b is identified as faulty, each of the memory cells A12, A22, . . . , AN2 are marked for erasure. Accordingly, the read control module 20 (e.g., the LLR estimation module 28) assigns a zero LLR to each of the memory cells A12, A22, . . . , AN2 (e.g., as the bit line 220b is faulty, the LLR estimation module 28 is not sure whether a 0 or a 1 is stored in each of these memory cells, and accordingly, assigns the zero LLR to each of these memory cells).

At 1216, the decoder module 32 attempts to re-decode the read data from each of the plurality of word lines, based on the zero LLR assigned to the memory cells associated with the faulty bit line.

Article of Manufacturing

In accordance with an embodiment, an article of manufacture may be provided that includes a storage medium having instructions stored thereon that, if executed, result in the operations described herein with respect to the methods 300, 400, 1000 and/or 1200 of FIGS. 3, 4 and 10 and/or 12, respectively (and/or various other operations discussed in the present disclosure). In an embodiment, the instructions, if executed, result in the operations being performed by the memory system 10 of FIG. 1. In an embodiment, the storage medium comprises some type of non-transitory memory (not shown). In accordance with various embodiments, the article of manufacture may be a computer-readable medium such as, for example, software or firmware.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description may use the terms "embodiment" or "embodiments," which may each refer to one or more of the same or different embodiments. Furthermore, the terms "comprising," "including," "having," and the like, as used with respect to embodiments, are synonymous.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

What is claimed is:

1. A method comprising:
   estimating a first set of log-likelihood ratio (LLR) values for a plurality of memory cells of a memory, wherein each LLR value of the first set of LLR values is assigned to a respective memory cell of the plurality of memory cells;
   based on the first set of LLR values, performing a first error correcting code (ECC) decoding operation;
   in response to determining a failure of the first ECC decoding operation, generating, by adjusting the first set of LLR values, a second set of LLR values for the plurality of memory cells, wherein each LLR value of the second set of LLR values is assigned to a respective memory cell of the plurality of memory cells, wherein each LLR value of the second set of LLR values is generated by decreasing a magnitude of a corresponding LLR value of the first set of LLR values by a corresponding amount; and
   based on the second set of LLR values, performing a second ECC decoding operation,
   wherein the first set of LLR values comprises at least a first LLR value and a second LLR value, wherein a magnitude of the first LLR value is greater than a magnitude of the second LLR value, and wherein generating the second set of LLR values further comprises
      generating the second set of LLR values such that the second set of LLR values comprises at least (i) a third LLR value that is generated by decreasing a magnitude of the first LLR value by a first value, and (ii) a fourth LLR value that is generated by decreasing a magnitude of the second LLR value by a second value,
   wherein based on the magnitude of the first LLR value being greater than the magnitude of the second LLR value, (i) the first value is greater than the second value, and (ii) a magnitude of the third LLR value is greater than a magnitude of the fourth LLR value.

2. The method of claim 1, wherein:
   the first set of LLR values have a first range;
   the second set of LLR values have a second range; and
   the second set of LLR values is generated such that the first range is greater than the second range.

3. The method of claim 1, wherein generating the second set of LLR values further comprises:
   determining that the first ECC decoding operation has failed; and
   generating the second set of LLR values.

4. The method of claim 1, wherein:
   the first set of LLR values comprises a plurality of LLR values; and
   each of the plurality of LLR values corresponds to a respective memory cell of the plurality of memory cells.

5. The method of claim 1, wherein generating the second set of LLR values further comprises:
   generating, using a non-linear mapping, the second set of LLR values from the first set of LLR values.

6. The method of claim 1, further comprising:
   in response to determining a failure of the second ECC decoding operation, generating, by adjusting the second set of LLR values, a third set of LLR values for the plurality of memory cells; and
   based on the third set of LLR values, performing a third ECC decoding operation, wherein the second set of LLR values have a first range, wherein the third set of LLR values have a second range, and wherein the first range is greater than the second range.

7. A memory system comprising:
   a memory;
   a estimation module configured to estimate a first set of log-likelihood ratio (LLR) values for a plurality of memory cells of the memory, wherein each LLR value of the first set of LLR values is assigned to a respective memory cell of the plurality of memory cells;
   a decoder module configured to, based on the first set of LLR values, perform a first error correcting code (ECC) decoding operation; and
   an error module configured to, in response to a failure of the first ECC decoding operation, generate, by adjusting the first set of LLR values, a second set of LLR values for the plurality of memory cells, wherein each LLR value of the second set of LLR values is assigned to a respective memory cell of the plurality of memory cells, wherein each LLR value of the second set of LLR values is generated by decreasing a magnitude of a corresponding LLR value of the first set of LLR values by a corresponding amount,
   wherein the first set of LLR values comprises at least a first LLR value and a second LLR value, wherein a magnitude of the first LLR value is greater than a magnitude of the second LLR value, wherein the second set of LLR values is generated such that the second set of LLR values comprises at least (i) a third LLR value that is generated by decreasing a magnitude of the first LLR value by a first value, and (ii) a fourth LLR value that is generated by decreasing a magnitude of the second LLR value by a second value,
   wherein based on the magnitude of the first LLR value being greater than the magnitude of the second LLR value, (i) the first value is greater than the second value, and (ii) a magnitude of the third LLR value is greater than a magnitude of the fourth LLR value, and
   wherein the decoder module is further configured to, based on the second set of LLR values, perform a second ECC decoding operation.

8. The memory system of claim 7, wherein:
   the first set of LLR values have a first range;
   the second set of LLR values have a second range; and
   the second set of LLR values is generated such that the first range is greater than the second range.

9. The memory system of claim 7, wherein the error module is configured to generate the second set of LLR values for the plurality of memory cells by:
   determining that the first ECC decoding operation has failed; and
   generating the second set of LLR values.

10. The memory system of claim 7, wherein:
    the first set of LLR values comprises a plurality of LLR values; and
    each of the plurality of LLR values corresponds to a respective memory cell of the plurality of memory cells.

11. The memory system of claim 7, wherein the error module is configured to generate the second set of LLR values for the plurality of memory cells by:

generating, using a non-linear mapping, the second set of LLR values from the first set of LLR values.

12. The memory system of claim 7, wherein the error module is further configured to:
in response to a failure of the second ECC decoding operation, generate, by adjusting the second set of LLR values, a third set of LLR values for the plurality of memory cells,
wherein the decoder module is further configured to, based on the third set of LLR values, perform a third ECC decoding operation,
wherein the second set of LLR values have a first range,
wherein the third set of LLR values have a second range, and
wherein the first range is greater than the second range.

* * * * *